United States Patent [19]
Vinn et al.

[11] Patent Number: 5,315,170
[45] Date of Patent: May 24, 1994

[54] TRACK AND HOLD CIRCUIT

[75] Inventors: Charles L. Vinn, Milpitas; Peter P. Hang, Sunnyvale, both of Calif.

[73] Assignee: Raytheon Company, Lexington, Mass.

[21] Appl. No.: 902,603

[22] Filed: Jun. 23, 1992

[51] Int. Cl.[5] .............................................. G11C 27/02
[52] U.S. Cl. ..................................... 307/353; 307/359; 307/491
[58] Field of Search ............... 307/353, 359, 491, 352, 307/494

[56] References Cited

U.S. PATENT DOCUMENTS

| | | | |
|---|---|---|---|
| 5,124,576 | 6/1992 | Jensen | 307/353 |
| 5,130,572 | 7/1992 | Stitt et al. | 307/353 |

FOREIGN PATENT DOCUMENTS

| | | | |
|---|---|---|---|
| 0132150 | 10/1979 | Japan | 307/353 |
| 0127498 | 5/1988 | Japan | 307/353 |
| 0231800 | 9/1988 | Japan | 307/353 |

OTHER PUBLICATIONS

RLA IC Design Manual, 1989, pp. 3-27, 3-28, Chapter Three. "Transistor-Based Sample/Hold".

*Primary Examiner*—John Zazworsky
*Attorney, Agent, or Firm*—William R. Clark; Richard M. Sharkansky

[57] ABSTRACT

A track and hold circuit for producing an output voltage having a level related to the voltage level of an input voltage fed to the circuit during a track mode and for maintaining the level of the output voltage constant during a hold mode. The circuit includes a current source and a capacitor with the capacitor being charged with the current or discharged selectively in accordance with the level of the input voltage relative to the level of the output voltage to produce at the capacitor the voltage related to the voltage level of the input voltage. Current from the current source is directed away from the capacitor during the hold mode in order to reduce the effect of charge stored during the track mode from slowing the transition from track mode to hold mode operation.

9 Claims, 1 Drawing Sheet

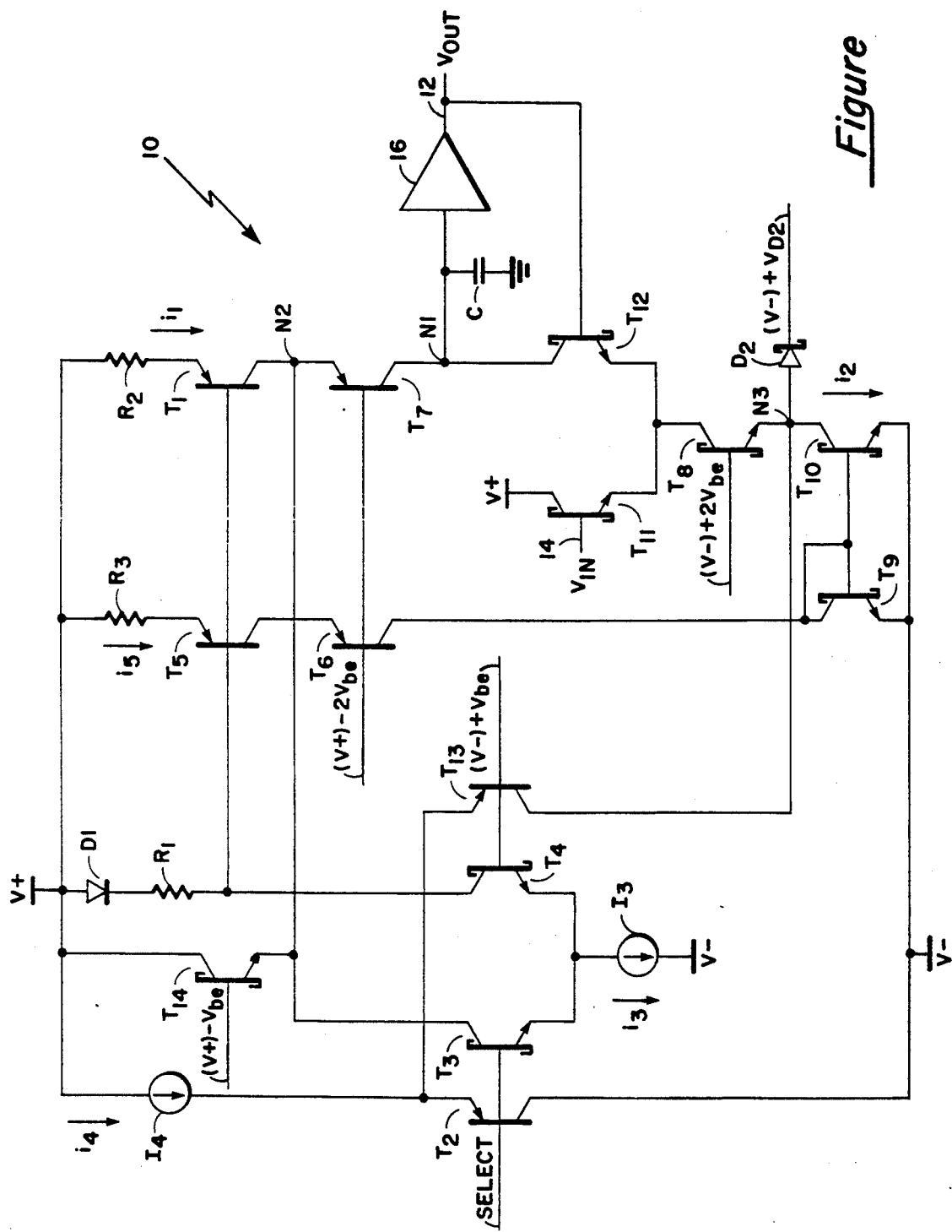
Figure

TRACK AND HOLD CIRCUIT

BACKGROUND OF THE INVENTION

This invention relates generally to track and hold circuits and more specifically to a track and hold circuit having increased speed of operation.

As is known in the art, a track and hold circuit (sometimes also referred to as a sample and hold circuit), operates in either: a track mode, during which the level of an output voltage produced by the circuit tracks (i.e. is equal to) the level of an input voltage fed to the circuit; or, a subsequent hold mode, during which the output voltage is held constant at the last level tracked during the track mode. More particularly, the output voltage of the track and hold circuit varies in accordance with the voltage produced at a capacitor, such capacitor being coupled to the junction between a first current source and the collector electrode of a first one of a matched pair of transistors. The pair of transistors have interconnected emitter electrodes coupled to a second, constant current source providing a current of twice the level of the first current source. The control electrode of the first transistor is fed by the output voltage of the circuit and the control electrode of the second transistor is fed by the input voltage to the circuit.

With this arrangement, during the track mode, the capacitor is charged or discharged selectively in response to the difference between the levels of the output voltage and the input voltage. For example, when the input voltage level and output voltage level are equal, the second current source current is supplied equally through both of the pair of transistors. However, when the input voltage level is greater than that of the output voltage, the current from the second current source flows substantially through the second transistor. Excess current from the first current source is then available to charge the capacitor, thereby increasing the voltage produced at such capacitor and concomitantly increasing the output voltage until it is equal to the input voltage. On the other hand, when the input voltage level is less than that of the output voltage, less than one-half of the current for the second current source flows through the second transistor so the capacitor is discharged to supply current to the second current source. Such discharging of the capacitor causes a decrease in the level of the voltage produced at such capacitor, thereby decreasing the output voltage. When the hold mode is selected, the current sources are shut off so that no current is available for either charging or discharging the capacitor. In this way, the voltage produced at the capacitor, and concomitantly, the output voltage of the circuit, is held constant. In other words, in the hold mode, the output voltage level is equal to the last voltage level tracked during the track mode.

As is also known in the art, the flow of current through the transistors comprising the current sources does not cease instantaneously once the transistor is biased to its cutoff point. Thus, some current will be available to charge or discharge the capacitor even after hold mode operation has been selected, thereby slowing the transition from track mode to hold mode operation. Additionally, the current source transistors have junction capacitance which stores charge during the track mode. Such stored charge further slows the transition between the track and hold modes of operation. More specifically, the effect of the time constant associated with stopping the flow of current through the transistors and the junction capacitance stored charge is that the output voltage of the circuit may not be held constant upon selection of hold mode until after further charging or discharging of the capacitor, thereby introducing error into the operation of the circuit. In other words, the output voltage level held during the hold mode may not be equal to the last voltage level tracked during the track mode. This problem is aggravated in circuits in which the value of the capacitor is small, as small amounts of current (i.e. the stored charge) will change the voltage produced at such a capacitor.

One way known in the art for reducing the effect of residual charge stored in the current source transistor junction capacitance during the track mode is to minimize the voltage swing across the junctions of such transistors. However, while this technique may reduce the effect of stored charge on the track to hold mode transition, it does not eliminate the problem. Moreover, this technique does not address the problem associated with the time constant of biasing the current source transistors to their cutoff points. Thus, this solution may not be satisfactory, particularly in high speed circuits where the transition time between track and hold mode is critical.

SUMMARY OF THE INVENTION

With the foregoing background in mind, it is an object of the present invention to provide a track and hold circuit having increased speed of operation.

It is a further object to provide a track and hold circuit having a fast transition time between track mode operation and hold mode operation.

A still further object is to reduce the effect of charge stored in the current source during the track mode on the operation of a track and hold circuit.

Another object is to decrease the time for the current provided by the current source to reach zero.

A still further object is to decrease such time without slowing the transition time from hold mode operation to track mode operation.

These and other objects are attained generally by providing a track and hold circuit for producing an output voltage having a level related to the voltage level of an input voltage during a track mode and for maintaining the level of said output voltage constant during a hold mode. The circuit includes means for tracking the level of the input voltage during the track mode comprising: a current source producing a current and means, including a capacitor, for charging the capacitor with the current or discharging the capacitor, selectively in accordance with the level of the input voltage relative to the level of the output voltage, to produce at such capacitor a voltage having a level related to the level of the input voltage. The output voltage of the circuit varies in accordance with the voltage produced at the capacitor. The circuit further includes means for maintaining the voltage produced at the capacitor constant during the hold mode and means for directing current from the current source away from the capacitor during the hold mode.

With this arrangement, the effect of the time constant associated with turning off the current sources and the charge stored in the current source transistor junction capacitance on the operation of the circuit and specifically on the transition time from track mode to hold mode is reduced. More specifically, the means for directing the current from the current source away from the capacitor during the hold mode eliminates the further charging or discharging of the capacitor heretofore occurring even after hold mode is selected.

BRIEF DESCRIPTION OF THE DRAWING

The foregoing features of the invention as well as the invention itself may be fully understood from the following detailed description read together with the accompanying drawing in which the single FIGURE is a schematic of a track and hold circuit in accordance with the present invention.

DESCRIPTION OF THE PREFERRED EMBODIMENT

Referring now to the single FIGURE, a track and hold circuit 10 is shown for producing, at an output 12 thereof, an output voltage $V_{out}$ having a level related to the voltage level of an input voltage $V_{in}$ fed to the circuit 10 at terminal 14 during a track mode and for maintaining the level of the output voltage $V_{out}$ constant during a hold mode. The circuit 10 includes means for tracking the level of the input voltage $V_{in}$ during the track mode comprising a current source, here provided by a current mirror arrangement including transistor $T_1$, producing a first current $i_1$. Here, the track and hold circuit 10 further includes a second current source also provided by a current mirror arrangement including transistor $T_{10}$ and producing a second current $i_2$, as will be described hereinafter. The current mirror comprising transistor $T_1$ will hereinafter be referred to as the first current source $T_1$ and the current mirror comprising transistor $T_{10}$ will hereinafter be referred to as the second current source $T_{10}$. The means for tracking the level of the input voltage $V_{in}$ during the track mode further includes a capacitor C being charged by the first current source $T_1$ or discharged selectively in accordance with the level of the input voltage $V_{in}$ relative to the level of the output voltage $V_{out}$ to produce, at capacitor C, a voltage having a level related to the level of the input voltage $V_{in}$. The output voltage $V_{out}$ varies in accordance with the voltage produced at the capacitor C, as will be described. The track and hold circuit 10 further includes means for maintaining the voltage produced at the capacitor C constant during the hold mode and means for directing current from the first current source $T_1$ and the second current source $T_{10}$ away from the capacitor C during the hold mode.

The manner in which the track mode or the hold mode is selected is by changing the voltage level of the SELECT signal applied to the base electrodes of transistors $T_2$ and $T_3$. Consider first the operation of the track and hold circuit 10 when the track mode is selected. Here, such track mode is selected by applying the SELECT signal in a low state. By doing so, transistor $T_3$ is turned off and transistor $T_2$ is on. Thus, all of the current $i_3$ from a third current source $I_3$ flows through transistor $T_4$. More particularly, transistors $T_4$ and $T_{13}$ have interconnected base or control electrodes, here, such electrodes being biased by a constant voltage having a level approximately equal to the negative supply voltage $V-$ plus the $V_{be}$ of transistor $T_4$. Thus, during the track mode, current $i_3$ flows from the positive supply voltage $V+$ through diode $D_1$, resistor $R_1$, and transistor $T_4$ to current source $I_3$ and the negative supply $V-$. Note that such flow of current $i_3$ causes a voltage drop across resistor $R_1$ which in turn biases transistors $T_5$ and $T_1$ to their conducting or active regions. More particularly, here, transistors $T_1$ and $T_5$ are arranged to mirror the current $i_3$. In other words, when $i_3$ flows through resistor $R_1$ as described, and transistors $T_1$ and $T_5$ are in their active regions, each of such transistors $T_1$ and $T_5$ has a current equal to $i_3$ flowing therethrough (i.e. current $i_1$ and $i_3$ are mirrored versions of current $i_3$). Note that in order to ensure accurate mirroring of the current $i_3$, resistor $R_3$ disposed in series with transistor $T_5$ and resistor $R_2$ disposed in series with transistor $T_1$ each has a resistance value equal to that of resistor $R_1$. Moreover, diode $D_1$ has a forward voltage drop equal to the $V_{be}$ of transistors $T_1$ and $T_5$.

Transistors $T_6$ and $T_7$, disposed in series with transistors $T_5$ and $T_1$, respectively, have interconnected base electrodes biased by a constant voltage, here having a level approximately equal to the positive supply voltage $V+$ minus $2V_{be}$, where $V_{be}$ is the voltage drop across the base/emitter junction of transistors $T_5$ and $T_6$. With this arrangement, when transistors $T_5$ and $T_1$ are in their active regions, as described above, so too are transistors $T_6$ and $T_7$. Thus, current $i_5$ flows from the positive supply $V+$ through transistor $T_5$, transistor $T_6$, and transistor $T_9$. That is, as the base and collector electrodes of transistor $T_9$ are interconnected, such transistor $T_9$ is also biased to its conducting state.

Transistor $T_9$, in combination with transistor $T_{10}$, comprises another current mirror arrangement to provide the second current source $T_{10}$. More particularly, when current $i_5$ (equal to $i_1$) flows from $V+$, through transistors $T_5$, $T_6$, and $T_9$, as described, transistor $T_{10}$ is biased to its conducting state and, as such transistor $T_{10}$ here has an emitter area twice the size of that of transistor $T_9$, the current $i_2$ flowing therethrough will be at twice the level of $i_1$. Like transistor $T_7$, transistor $T_8$ is biased by a constant voltage, here approximately equal to the negative supply voltage $V-$ plus $2V_{be}$, where $V_{be}$ is the base to emitter voltage drop of transistors $T_8$ and $T_{10}$. In this way, when transistor $T_{10}$ is conducting, so too is transistor $T_8$. The purpose of transistors $T_7$ and $T_8$ in track and hold circuit 10 will be better understood after the following description of the track mode operation.

Transistors $T_{11}$ and $T_{12}$ are a matched pair of transistors having interconnected emitter electrodes. Such interconnected emitter electrodes are further coupled to the collector electrode of transistor $T_8$ and further, through such transistor $T_8$ to the second current source $T_{10}$. The base or control electrode of transistor $T_{11}$ is fed by the input signal or voltage $V_{in}$ and the collector electrode thereof is coupled to the positive supply voltage $V+$. The base or control electrode of transistor $T_{12}$ is coupled to the output 12 (i.e. is fed by $V_{out}$) of the track and hold circuit 10, as shown. The collector and emitter electrodes of transistor $T_{12}$ are coupled in series with transistors $T_7$ and $T_8$, respectively. Circuit junction or node N1, disposed between the collector of transistor $T_{12}$ and the collector of transistor $T_7$ is further coupled to a first terminal of capacitor C and to the input of a buffer amplifier 16, here having a unity gain, the second terminal of capacitor C being coupled to a reference voltage and here to ground. Note that the buffer amplifier 16 has a high input impedance so that negligible current will flow therein in order to isolate the output 12 from the capacitor C.

With the above transistor conditions in mind, consider first the case where the level of the input voltage $V_{in}$ is equal to that of the output voltage $V_{out}$. Under such a condition, the current flowing from the positive supply $V+$ through $T_{11}$ is equal to $i_1$ as is the current provided by the first current source $T_1$ and flowing though transistors $T_7$ and $T_{12}$. In this way, the current $i_2$ from the second current source $T_{10}$ is provided half through $T_{11}$ and half through $T_{12}$.

However, consider next a situation where the level of the input voltage $V_{in}$ is greater than that of the output voltage $V_{out}$. In this case, the current flowing through transistor $T_{11}$ is greater than $i_1$ (i.e. as the control electrode of such transistor $T_{11}$ is fed by a more positive voltage than that of matched transistor $T_{12}$). As a current level greater than $i_1$ flows through transistor $T_{11}$, it follows that less than $i_1$ flows through transistor $T_{12}$ to provide current $i_2$. More specifically, the excess current provided by the first current source $T_1$ will charge capacitor C. In this way, the voltage produced at such capacitor C and specifically at circuit node N1 is increased, thereby concomitantly increasing the output voltage $V_{out}$. Such operation continues until the level of the output voltage $V_{out}$ is equal to that of the input voltage $V_{in}$.

Similarly, when the level of the input voltage $V_{in}$ is less than that of the output voltage $V_{out}$, the current provided through transistor $T_{11}$ is less than $i_1$ so that the remainder of the current $i_2$ for the second current source $T_2$ will be supplied through transistor $T_{12}$. As the first current source $T_1$ supplies only $i_1$, the remainder of current $i_2$ is supplied by the capacitor C. That is, the capacitor C discharges until the voltage produced at such capacitor C (i.e. at node N1), and the resulting output voltage $V_{out}$, are equal to the input voltage $V_{in}$.

From the foregoing it is apparent that the voltage produced at the capacitor C which provides the output voltage $V_{out}$ via buffer amplifier 16 varies in accordance with the difference in the level of the output voltage $V_{out}$ as compared to the level of the input voltage $V_{in}$. In other words, and as described, when the input voltage $V_{in}$ is greater than the output voltage $V_{out}$, the capacitor C is charged by the first current source $T_1$ and when the input voltage $V_{in}$ is less than the output voltage $V_{out}$, the capacitor C is discharged. In this way, the output voltage $V_{out}$ (i.e. here equal to the voltage produced at capacitor C) tracks the input voltage $V_{in}$.

Note that when the track and hold circuit 10 is in the track mode as described above, transistor $T_2$ is biased to its active region, as mentioned. During the track mode, a fourth current source $I_4$ provides a flow of current $i_4$ of a level to be described below through transistor $T_2$ and to the negative supply $V-$.

When hold mode operation is desired, the SELECT signal is provided in a high state and transistors $T_2$ and $T_4$ are biased to their cutoff points while transistors $T_3$ and $T_{13}$ are biased to their active regions. With this arrangement, current ceases to flow through diode $D_1$ and resistor $R_1$ so that the voltage previously biasing transistors $T_1$ and $T_5$ to their conducting states approaches zero. While ideally, this action would immediately cause current to stop flowing through transistors $T_1$ and $T_5$ (and thus also through transistors $T_7$, $T_8$, $T_{10}$, and $T_{12}$), the decay of bias voltage at the base electrodes of such transistors $T_1$ and $T_5$ has a time constant associated therewith. Thus, some residual current will continue to so flow and will tend to either charge capacitor C (i.e. if the level of the input voltage $V_{in}$ is greater than that of the output voltage $V_{out}$) or discharge such capacitor C (i.e. if the level of the input voltage $V_{in}$ is less than that of the output voltage $V_{out}$), as described in conjunction with the track mode operation. This residual current flow through transistors $T_2$, $T_7$, $T_{12}$, $T_8$, and $T_{10}$ results in an error in the output voltage $V_{out}$ when switching from the track to the hold mode. In other words, there will be a delay from the time the hold mode is selected until the voltage produced at capacitor C (i.e. and thus the output voltage $V_{out}$) is held constant. That is, the voltage held during the hold mode may not be equal to the last voltage tracked during the track mode before the hold mode was selected. Moreover, such error tends to be aggravated by charge stored in the transistor junction capacitance, particularly of transistors $T_7$ and $T_{12}$. It may now be appreciated that the purpose of transistors $T_7$ and $T_8$ is to reduce the effect of such junction capacitance on the track to hold mode transition. More specifically, the base electrodes of such transistors $T_7$ and $T_8$ are biased by constant voltages, as described, so as to maintain the collector and emitter electrodes thereof at a substantially constant voltage level (i.e. the voltage swing across such junctions is thus equal to the variation of the voltage produced at the capacitor). As the voltage swing between such electrodes is thus reduced, so too is the charge stored in the junction capacitance.

In the present arrangement, the transition from track mode to hold mode is facilitated in such a way as to reduce the effect of the time constant associated with turning off current source transistors $T_1$ and $T_{10}$ as well as the effect of the junction capacitance stored charge. This is achieved by providing means for directing the currents $i_1$ and $i_2$ from such current source transistors $T_1$ and $T_{10}$ away from the capacitor C during the hold mode. In other words, the effect of such current directing means is to "hold" the voltage produced at the capacitor C quicker upon selecting hold mode operation, as will now be described.

Consider the hold mode operation of track and hold circuit 10, keeping in mind that transistors $T_3$ and $T_{13}$ are then conducting, as noted above. With this arrangement, any residual current flowing through transistor $T_1$ is routed through transistor $T_3$. Similarly, like charge associated with transistor $T_{10}$ is routed from current source $I_4$ through transistor $T_{13}$. In other words, such current paths direct or steer current otherwise available to charge or discharge capacitor C away from such capacitor C.

Note that transistor $T_{14}$, having collector and emitter electrodes coupled between the positive supply $V+$ and a circuit node N2, respectively, is biased by a constant voltage having a level approximately equal to the positive supply voltage $V+$ minus the $V_{be}$ of transistor $T_{14}$. It is apparent that as the charge from transistor $T_1$ is being directed away from transistor $T_7$ (and thus away from capacitor C), the voltage at circuit node N2 is decreasing. When the voltage at node N2 decreases to a level equal to approximately the positive supply voltage $V+$ minus the $V_{be}$ of transistor $T_{14}$, transistor $T_{14}$ is biased to its active region. Transistor $T_{14}$ then clamps the voltage at circuit node N2 to this voltage level and the current $i_3$ will flow to current source $I_3$ from the positive supply $V+$ through transistor $T_{14}$.

Similar clamping action is provided by a diode $D_2$. More specifically, as current flows from current source $I_4$ through transistor $T_{13}$ to provide the residual current to transistor $T_{10}$, the voltage at the collector of such transistor $T_{10}$ (i.e. the voltage at circuit node N3) is rising. When such voltage reaches a level equal to approximately the forward voltage drop of diode $D_2$ (i.e. $V_{D2}$) plus the negative supply voltage $V-$, diode $D_2$ will become forward biased and the current in excess of that demanded by transistor $T_{10}$ will flow through diode $D_2$. More particularly, the conduction of diode $D_2$ will clamp the voltage at circuit node N3 to such voltage level of $V-$ plus $V_{D2}$.

Transistor $T_{14}$ and diode $D_2$, here functioning as clamping devices as described, provide several benefits to the track and hold circuit 10. First, in order to eliminate error associated with charge stored in the junction capacitance between the emitter and collector electrodes of transistor $T_7$ and like junction capacitance of transistor $T_8$, it is desirable to limit the downward voltage swing at circuit node N2 and the upward voltage swing at node N3, respectively. This desirable result is achieved by the clamping provided by transistor $T_{14}$ and diode $D_2$, respectively. Also, significant downward and upward voltage swings at nodes N2 and N3, respectively, may degrade the performance of transistors $T_7$ and $T_8$ over time. Finally, if the voltage levels at such circuit nodes N2 and N3 were not clamped, the transition from hold mode operation to track mode operation may be slowed. In other words, these potential voltage swings are opposite of what the nodes N2 and N3 experience during track mode operation (i.e. during track mode transistor $T_1$ is conducting and thus node N2 is at a voltage potential of $V+$ minus the $V_{be}$ of transistor $T_1$ and transistor $T_{10}$ is also conducting bringing node N3 to a potential of $V-$ plus the $V_{be}$ of transistor $T_{10}$). Thus, without the clamping described above, the time to bring such nodes to their track mode voltage potentials would be increased.

Note that it is desirable not only to have the current in transistors $T_7$ and $T_8$ decay fast, it is further desirable to have such currents decay at the same rate. This identical rate of current reduction in transistors $T_7$ and $T_8$ is achieved by the fact that the currents $i_1$ and $i_2$ are provided by the same voltage source $V+$.

Having described a preferred embodiment of this invention, it is now evident that other embodiments incorporating its concepts may be used. It is felt, therefore, that this invention should not be restricted to such preferred embodiment, but rather should be limited only by the spirit and scope of the appended claims.

What is claimed is:

1. A track and hold circuit for producing an output voltage having a level related to the voltage level of an input voltage during a track mode and for maintaining the level of said output voltage constant during a hold mode, said circuit comprising:
    (a) means for tracking the level of the input voltage during the track mode comprising:
        (i) a current source producing a current; and
        (ii) means, including a capacitor, for charging the capacitor with said current or discharging the capacitor, selectively in accordance with the level of the input voltage relative to the level of the output voltage to produce at such capacitor a voltage having a level related to the level of the input voltage during the track mode, the output voltage varying in accordance with the voltage produced at the capacitor; and
    (b) means for switching off said current source and said charging and discharging means in response to a hold mode control signal, said switching means being coupled to a node between said current source and said capacitor to draw residual current from said current source during a transition period as said current source is being turned off.

2. A track and hold circuit for producing an output voltage having a level related to the voltage level of an input voltage during a track mode and for maintaining the level of said output voltage constant during a hold mode, said circuit comprising:
    mode switch means comprising a differential pair of transistors wherein, in the track mode, a first one of said differential pair of transistors is on and the second one is off in accordance with a mode control signal and, in the hold mode, the first one of said differential pair of transistors is off and the second one is on in accordance with the mode control signal;
    current mirror means responsive to current flowing through said first one of said transistors for sourcing a first predetermined current to a first node coupled to a charging capacitor and for sinking a second predetermined current wherein a portion of the second current drawn from said first node is in accordance with the level of the input voltage relative to the level of the output voltage; and
    said second one of said differential pair of transistors of said mode switch means being coupled to a node between said current mirror circuit and said first node to draw residual current from said current mirror circuit during a transition period as said first predetermined current is being turned off by turning off the flow of current through said first one of said differential pair of transistors.

3. The circuit recited in claim 2 further comprising means for clamping the voltage at said node between said current mirror circuit and said first node.

4. The circuit recited in claim 2 further comprising means for supplying current for sinking said second predetermined current when said second one of said differential pair of transistors is turned on.

5. The circuit recited in claim 4 further comprising means for clamping the voltage at an input node to said sinking means.

6. The circuit recited in claim 4 wherein said sinking current supplying means comprises a switching transistor connected between a source of current and said input node to said sinking means.

7. The circuit recited in claim 2 wherein said differential pair of transistors have corresponding electrodes connected in common to a source of current.

8. The circuit recited in claim 7 wherein said mode control signal is coupled to the base of said second one of said differential pair of transistors.

9. The circuit recited in claim 2 wherein said current mirror means comprises a diode and resistor connected in series between a voltage source and an electrode of said first one of said differential pair of transistors.

* * * * *